United States Patent
Schloffer et al.

(10) Patent No.: US 10,590,527 B2
(45) Date of Patent: Mar. 17, 2020

(54) HIGH-TEMPERATURE PROTECTIVE LAYER FOR TITANIUM ALUMINIDE ALLOYS

(71) Applicant: MTU Aero Engines AG, Munich (DE)

(72) Inventors: Martin Schloffer, Munich (DE); Heiko Warnecke, Goettingen (DE)

(73) Assignee: MTU AERO ENGINES AG, Munich (DE)

( * ) Notice: Subject to any disclaimer, the term of this patent is extended or adjusted under 35 U.S.C. 154(b) by 107 days.

(21) Appl. No.: 15/825,170

(22) Filed: Nov. 29, 2017

(65) Prior Publication Data
US 2018/0163291 A1    Jun. 14, 2018

(30) Foreign Application Priority Data
Dec. 8, 2016 (DE) .......... 10 2016 224 532

(51) Int. Cl.
| | |
|---|---|
| *B32B 15/01* | (2006.01) |
| *C23C 14/16* | (2006.01) |
| *C22C 14/00* | (2006.01) |
| *C22C 21/00* | (2006.01) |
| *C22C 30/00* | (2006.01) |
| *C23C 30/00* | (2006.01) |
| *F01D 5/28* | (2006.01) |

(52) U.S. Cl.
CPC .......... *C23C 14/165* (2013.01); *B32B 15/01* (2013.01); *C22C 14/00* (2013.01); *C22C 21/003* (2013.01); *C22C 30/00* (2013.01); *C23C 30/00* (2013.01); *F01D 5/288* (2013.01); *B32C 15/016* (2013.01); *F05D 2300/121* (2013.01); *F05D 2300/174* (2013.01); *F05D 2300/182* (2013.01)

(58) Field of Classification Search
None
See application file for complete search history.

(56) References Cited

U.S. PATENT DOCUMENTS

| | | | |
|---|---|---|---|
| 5,393,356 A | 2/1995 | Singheiser | |
| 5,837,387 A | 11/1998 | Brady et al. | |
| 6,855,212 B2 | 2/2005 | Raybould et al. | |
| 7,135,238 B2 | 11/2006 | Raybould et al. | |
| 7,699,581 B2 | 4/2010 | Bayer et al. | |
| 8,475,882 B2 | 7/2013 | Schaeffer et al. | |
| 9,657,395 B2 * | 5/2017 | Schloffer | C23C 14/025 |
| 10,029,309 B2 * | 7/2018 | Schloffer | B22F 9/08 |
| 10,060,012 B2 * | 8/2018 | Schloffer | C22C 30/00 |
| 2009/0293447 A1 | 12/2009 | Roth-Fagaraseanu et al. | |
| 2016/0010184 A1 | 1/2016 | Smarsly et al. | |
| 2016/0017154 A1 | 1/2016 | Strock et al. | |

FOREIGN PATENT DOCUMENTS

| | | |
|---|---|---|
| CN | 104480444 A | 4/2015 |
| DE | 4222210 C1 | 8/1993 |
| DE | 4435321 A1 | 4/1996 |
| DE | 102007060254 A1 | 6/2009 |
| EP | 0581204 A1 | 2/1994 |
| EP | 2071046 A2 | 6/2009 |

* cited by examiner

*Primary Examiner* — Daniel J. Schleis
(74) *Attorney, Agent, or Firm* — Abel Schillinger, LLP

(57) ABSTRACT

Disclosed is a process for coating a component of a TiAl alloy in order to improve the high-temperature resistance of the component. The process comprises depositing a Pt- and Cr-free protective layer alloy comprising Ti, Al, Nb, Mo and B and optionally one or more of W, Si, C, Zr, Y, Hf, Er and Gd on the component by physical vapor deposition at a temperature of less than or equal to 600° C. The protective layer alloy has a higher Al content than the TiAl alloy of the component. A coated component made by this process is also disclosed.

20 Claims, No Drawings

HIGH-TEMPERATURE PROTECTIVE LAYER FOR TITANIUM ALUMINIDE ALLOYS

CROSS-REFERENCE TO RELATED APPLICATIONS

The present application claims priority under 35 U.S.C. § 119 of German Patent Application No. 102016224532.5, filed Dec. 8, 2016, the entire disclosure of which is expressly incorporated by reference herein.

BACKGROUND OF THE INVENTION

1. Field of the Invention

The present invention relates to a process for producing a high-temperature protective layer and in particular an oxidation protection layer for TiAl alloys and also a component composed of a TiAl alloy having a corresponding protective layer, in particular a component for a turbomachine such as a gas turbine or an aircraft engine.

2. Discussion of Background Information

Titanium aluminides and alloys thereof are, owing to the intermetallic phases such as $\alpha_2$-Ti$_3$Al and $\gamma$-TiAl present in these materials, which give the materials high strength combined with a low specific gravity, materials of interest for a very wide variety of components in air and space travel and also in engine construction or the chemical industry. However, their use at temperatures in the region above 700° C.-750° C. is restricted by an unsatisfactory hot gas and high-temperature oxidation resistance of the TiAl materials, even though the formation of a slowly growing and thus protective aluminum oxide layer could he expected from the high aluminum content. Accordingly, attempts to improve the hot gas corrosion resistance and oxidation resistance in order to make higher use temperatures possible are known from the prior art.

For this purpose, WO 03/071002 A1, the entire disclosure of which is incorporated by reference herein, for example, proposes depositing an aluminum layer on the surface of a component composed of a TiAl material and subsequently subjecting this to a heat treatment so that the aluminum is oxidized and the TiAl material underneath becomes enriched in this as a result of diffusion. Although high-temperature oxidation protection can be achieved in this way by formation of an impermeable, slowly growing aluminum oxide layer on the surface, impairment of the strength of the base material can occur as a result of diffusion of aluminum into the surface region of the TiAl material of the component, for example as a result of brittle aluminum-rich, intermetallic phases being formed.

Furthermore, EP 2 071 046 A2, the entire disclosure of which is incorporated by reference herein, proposes a platinum-based high-temperature protective layer based on TiAl, while the U.S. Pat. No. 5,837,387, the entire disclosure of which is incorporated by reference herein, proposes a chromium-containing TiAl high-temperature protective layer. However, the two coatings based on TiAl alloys likewise have the problem that phase transformations can occur in the surface region of the TiAl base material of the component to be protected as a result of the high proportions of platinum and chromium.

Accordingly, there continues to he a need for a high-temperature protective layer which makes it possible to provide components based on a TiAl alloy for uses in the range above 700° Celsius with a high-temperature protective layer which, in particular, prevents rapid oxidation of the TiAl base material and diffusion of oxygen into the surface region of the base material.

In view of the foregoing, it would be advantageous to have available a high-temperature protective layer and in particular an oxidation protection layer for components composed of TiAl alloys, which layer makes it possible to increase the use temperature of TiAl materials without impairing the mechanical properties. Furthermore, the coating should be simple to produce and reliable in use.

SUMMARY OF THE INVENTION

The present invention provides a process for coating a component of a TiAl alloy in order to improve the high-temperature resistance of the component. The process comprises depositing on the component by physical vapor deposition at a temperature of less than or equal to about 600° C. a Pt- and Cr-free protective layer TiAl alloy comprising

| | |
|---|---|
| Al | from about 57 to about 65 at. %, |
| Nb | from about 3 to about 6 at. %, |
| Mo | from about 0.2 to about 2 at. %, |
| B | from about 0.05 to about 0.2 at. %, |
| W | from 0 to about 3 at. %, |
| Si | from 0 to about 0.5 at. %, |
| C | from 0 to about 0.6 at. %, |
| Zr | from 0 to about 6 at. %, |
| Y | from 0 to about 0.5 at. %, |
| Hf | from 0 to about 0.3 at. %, |
| Er | from 0 to about 0.5 at. %, |
| Gd | from 0 to about 0.5 at. % | and titanium as balance. The protective layer TiAl alloy has a higher Al content than the TiAl alloy of the component.

In one aspect of the process, the physical vapor deposition may be carried out by cathode atomization. For example, the target for cathode atomization may be produced by a powder-metallurgical route.

In another aspect, the protective TiAl alloy may be deposited on the component in a layer thickness of from 10 µm to 100 µm, for example, in a layer thickness of from 15 µm to 50 µm.

In yet another aspect the process, the component on which the coating is carried out may be formed by a TiAl alloy which comprises at least 30 at. % of titanium and at least 30 at. % of aluminum.

In a still further aspect, a heat treatment may be carried out after deposition of the high-temperature protective layer in order to set a microstructure of the high-temperature protective layer.

The present invention also provides a component, for example a component of a turbomachine, which has a base material of a TiAl alloy and comprises an oxidation protection coating which is arranged on at least part of the surface of the component and is composed of a Pt- and Cr-free protective layer TiAl alloy comprising

| | |
|---|---|
| Al | from about 57 to about 65 at. %, |
| Nb | from about 3 to about 6 at. %, |
| Mo | from about 0.2 to about 2 at. %, |
| B | from about 0.05 to about 0.2 at. %, |
| W | from 0 to about 3 at. %, |
| Si | from 0 to about 0.5 at. %, |
| C | from 0 to about 0.6 at. %, |

| | |
|---|---|
| Zr | from 0 to about 6 at. %, |
| Y | from 0 to about 0.5 at. %, |
| Hf | from 0 to about 0.3 at. %, |
| Er | from 0 to about 0.5 at. %, |
| Gd | from 0 to about 0.5 at. % | and titanium as balance. The protective layer alloy has a higher Al content than the TiAl alloy of the component.

In one aspect of the component, the protective layer TiAl alloy may have been deposited on the component by physical vapor deposition at a temperature of less than or equal to about 600° C.

In another aspect, the proportion of γ-TiAl phase in the coating may make up about 75% by volume or more, e.g., about 90% by volume or more, of the microstructure and/or a γ-TiAl matrix having an intrinsically closed or network-like or globular microstructure may be present in the coating.

In yet another aspect of the component, precipitates in the coating may comprise ZrO₂ and/or Y₂O₃ and/or the coating may have a porosity of less than or equal to about 1% by volume, e.g., less than or equal to about 0.5% by volume.

As set forth above, it is proposed to provide a protective layer alloy having a higher aluminum content than the alloy of the base material as high-temperature protective layer on a component composed of a TiAl alloy, with particular elements such as platinum or chromium or else nickel not being used so as to avoid an unfavorable influence on the base material by corresponding phase transformations. The protective layer alloy is formed by a TiAl alloy which comprises from about 57 to about 65 at. % of aluminum, from about 3 to about 6 at. % of niobium, from about 0.2 to about 2 at. % of molybdenum and from about 0.05 to about 0.2 at. % of boron together with titanium as balance, with further alloy constituents being able to be present, in particular tungsten, carbon, zirconium, yttrium, hafnium, erbium, gadolinium, silicon. Thus, the protective layer alloy has the following composition:

| | |
|---|---|
| Al | from about 57 to about 65 at. %, |
| Nb | from about 3 to about 6 at. %, |
| Mo | from about 0.2 to about 2 at. %, |
| B | from about 0.05 to about 0.2 at. %, |
| W | from 0 to about 3 at. %, |
| Si | from 0 to about 0.5 at. %, |
| C | from 0 to about 0.6 at. %, |
| Zr | from 0 to about 6 at. %, |
| Y | from 0 to about 0.5 at. %, |
| Hf | from 0 to about 0.3 at. %, |
| Er | from 0 to about 0.5 at. %, |
| Gd | from 0 to about 0.5 at. % | and titanium as balance.

As a result of the high proportion of aluminum in the TiAl alloy which is applied as coating, it can be ensured that a slowly growing, protective aluminum oxide layer is formed on the surface.

The addition of silicon, erbium and/or gadolinium can inhibit diffusion of oxygen into the material, so that the inward diffusion of oxygen which is observed at temperatures above about 700° Celsius in the case of present-day TiAl alloys can be reduced or avoided and, independently and in conjunction with the aluminum-rich phases which are insensitive to attack by oxygen, the destabilization of the microstructure by oxygen attack in the outer zones of the component can therefore be reduced or prevented.

In addition, the invention provides for the coating to be deposited by physical vapor deposition (PVD) at a temperature of less than or equal to about 600° Celsius, so that no unfavorable change in the base material can occur during coating as a result of the heat stress either. An effective high-temperature protective layer can thereby be achieved while at the same time maintaining the mechanical properties of the component or of the microstructure of the base material. The deposition of the coating can be carried out by cathode atomization and in particular by magnetron sputtering. The target which is atomized by cathode atomization and is formed by the protective layer alloy which is to be deposited on the component can be produced by a powder-metallurgical route, with the target being able to have a fine-grained microstructure. As a result of a fine-grained microstructure, uniform deposition rates and a homogeneous element distribution of the alloy in the coating are achieved. The target material can have a composition which is slightly different from that of the protective layer alloy in order to compensate for losses of alloy components which may possibly occur during coating, so that the deposited coating has a composition corresponding to the desired protective layer alloy.

The protective layer alloy can be deposited on the TiAl component in a layer thickness of from about 5 μm to about 100 μm, in particular from about 15 μm to about 50 μm, so that inward diffusion of oxygen down to the base material can be reliably prevented.

In the following, a TiAl alloy is understood to be an alloy whose main constituents are titanium and aluminum, so that the proportion of aluminum and titanium in at. % or percent by weight is in each case greater than the corresponding proportion of any other alloy component. Here, the proportion of aluminum in at. % or percent by weight can be greater than the proportion of titanium, even when the name TiAl appears to indicate the contrary. In addition, a TiAl alloy is understood to be an alloy which is made up predominantly of intermetallic phases having the constituents titanium and/or aluminum. Intermetallic phases are understood to be phases of the TiAl system which have a high proportion of covalent bonding forces within the metallic bond and thus have a high strength and in particular also high-temperature resistance.

The component on which coating occurs and which is formed by a TiAl alloy having an Al content lower than that of the coating can be formed by a TiAl alloy comprising at least about 30 at. % of titanium and at least about 30 at. % of aluminum. The further alloy constituents can vary over a wide range and encompass all technically usable TiAl alloys.

In particular, the TiAl alloy of the component or base material can be a TiAl alloy based on the intermetallic γ-TiAl phase which is alloyed with niobium and molybdenum or boron and can therefore be referred to as a TNM or TNB alloy. Such alloys comprise titanium as main constituent and from about 40 to about 45 at. % of aluminum, about 5 at. % of niobium and, for example, about 1 at. % of molybdenum and also small proportions of boron. The microstructure is characterized by a high proportion of γ-TiAl and likewise significant proportions of α₂-Ti₃Al, with further phases such as β phase or B19 phase being able to occur in a small proportion.

After deposition of the coating, a heat treatment can be carried out in order to set the microstructure in the high-temperature protective layer in the desired way.

In the case of a component having an appropriately deposited high-temperature protective layer composed of a TiAl alloy which is richer in aluminum than the TiAl alloy of the base material, constituents such as platinum or chromium can be dispensed with while ensuring that only slight, if any, changes in the microstructural configuration of the surface region of the base material occur. The aluminum-rich TiAl alloy which is deposited on the component composed of a TiAl material can have a composition as a result of which, in particular, the proportion of the γ-TiAl phase is greater than or equal to about 75% by volume, in particular greater than or equal to about 90% by volume, of the microstructure of the high-temperature protective layer. In particular, the TiAl alloy which is preferably used and has been described above makes it possible to deposit a coating having a matrix which is composed of γ-TiAl and has an intrinsically closed globular microstructure. The proportion of the γ-TiAl can be greater than or equal to about 90% by volume of the microstructure. Various further phases, for example α phase or aluminum-rich intermetallic phases such as $Al_3Ti$ and $Al_2Ti$, can be provided in the γ-TiAl matrix. In addition, oxides and/or carbides and/or silicides can be formed. In particular, proportions of zirconium and yttrium in the coating material can be converted by the heat treatment which follows the coating operation into zirconium oxides and yttrium oxides in the coating.

To avoid penetration of oxygen into the base material of the component, the coating is made very impermeable and can have a porosity which is less than or equal to about 1% by volume, in particular less than or equal to about 0.5% by volume.

As a result of the impermeable configuration of the coating having a high aluminum content, penetration of oxygen into the base material can be prevented and oxidative attack can be limited by a slowly growing aluminum oxide layer which forms during high-temperature use. In addition, since further alloy constituents, with the exception of the alloying elements indicated, in the TiAl alloy are dispensed with for the coating, and/or the proportion of the alloying elements is restricted, it is possible to prevent microstructural transformations in the surface zone of the base material of the component to be coated from occurring and adversely affecting the mechanical properties.

DETAILED DESCRIPTION OF EMBODIMENT OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show details of the present invention in more detail than is necessary for the fundamental understanding of the present invention, the description making apparent to those of skill in the art how the several forms of the present invention may be embodied in practice.

EXAMPLE

A coating having the composition 61 at. % of aluminum, 4 at. % of niobium, 1 at. % of molybdenum, 0.2 at. % of silicon, 0.3 at. % of carbon, 0.1 at. % of yttrium and 0.1 at. % of boron and Ti as balance is deposited in a thickness in the range from 15 to 50 microns on a component of a turbomachine composed of a TiAl alloy as described by way of example above by cathode atomization at a temperature below 600° Celsius.

During aging at 900° Celsius for 1000 hours, an impermeable, firmly adhering aluminum oxide covering layer is formed, with an increase in mass of less than or equal to about 2 mg per $cm^2$. No phase transformations and/or formation of brittle phases are observed in the interfacial region between high-temperature protective layer and base material.

What is claimed is:

1. A process for coating a component of a TiAl alloy in order to improve the high-temperature resistance of the component, wherein the process comprises depositing on the component by physical vapor deposition at a temperature of less than or equal to 600° C. a Pt- and Cr-free protective layer TiAl alloy comprising

| Al | from 57 to 65 at. %, |
|----|----------------------|
| Nb | from 3 to 6 at. %, |
| Mo | from 0.2 to 2 at. %, |
| B  | from 0.05 to 0.2 at. %, |
| W  | from 0 to 3 at. %, |
| Si | from 0 to 0.5 at. %, |
| C  | from 0 to 0.6 at. %, |
| Zr | from 0 to 6 at. %, |
| Y  | from 0 to 0.5 at. %, |
| Hf | from 0 to 0.3 at. %, |
| Er | from 0 to 0.5 at. %, |
| Gd | from 0 to 0.5 at. % | and titanium as balance, the protective layer TiAl alloy having a higher Al content than the TiAl alloy of the component.

2. The process of claim 1, wherein the physical vapor deposition is carried out by cathode atomization.

3. The process of claim 2, wherein a target for cathode atomization is produced by a powder-metallurgical route.

4. The process of claim 1, wherein the protective TiAl alloy is deposited on the component in a layer thickness of from 10 μm to 100 μm.

5. The process of claim 1, wherein the protective TiAl alloy is deposited on the component in a layer thickness of from 15 μm to 50 μm.

6. The process of claim 1, wherein the component on which coating is carried out is formed by a TiAl alloy which comprises at least 30 at. % of titanium and at least 30 at. % of aluminum.

7. The process of claim 1, wherein a heat treatment is carried out after deposition of the high-temperature protective layer in order to set a microstructure of the high-temperature protective layer.

8. A component having a base material of a TiAl alloy, wherein the component comprises an oxidation protection coating which is arranged on at least part of a surface of the component and is composed of a Pt- and Cr-free protective layer TiAl alloy comprising

| Al | from 57 to 65 at. %, |
|----|----------------------|
| Nb | from 3 to 6 at. %, |
| Mo | from 0.2 to 2 at. %, |
| B  | from 0.05 to 0.2 at. %, |
| W  | from 0 to 3 at. %, |
| Si | from 0 to 0.5 at. %, |
| C  | from 0 to 0.6 at. %, |
| Zr | from 0 to 6 at. %, |
| Y  | from 0 to 0.5 at. %, |
| Hf | from 0 to 0.3 at. %, |
| Er | from 0 to 0.5 at. %, |
| Gd | from 0 to 0.5 at. % | and titanium as balance, which alloy has a higher Al content than the TiAl alloy of the component.

9. The component of claim 8, wherein the component is a component of a turbomachine.

10. The component of claim 8, wherein the protective layer TiAl alloy has been deposited on the component by physical vapor deposition at a temperature of less than or equal to 600° C.

11. The component of claim 8, wherein a proportion of γ-TiAl phase in the coating makes up 75% by volume or more of a microstructure.

12. The component of claim 8, wherein a proportion of γ-TiAl phase in the coating makes up 90% by volume or more of a microstructure.

13. The component of claim 8, wherein a γ-TiAl matrix having an intrinsically closed or network-like or globular microstructure is present in the coating.

14. The component of claim 11, wherein a γ-TiAl matrix having an intrinsically closed or network-like or globular microstructure is present in the coating.

15. The component of claim 8, wherein precipitates in the coating comprise $ZrO_2$ and/or $Y_2O_3$.

16. The component of claim 11, wherein precipitates in the coating comprise $ZrO_2$ and/or $Y_2O_3$.

17. The component of claim 14, wherein precipitates in the coating comprise $ZrO_2$ and/or $Y_2O_3$.

18. The component of claim 8, wherein the coating has a porosity of less than or equal to 1% by volume.

19. The component of claim 8, wherein the coating has a porosity of less than or equal to 0.5% by volume.

20. The component of claim 11, wherein the coating has a porosity of less than or equal to 1% by volume.

* * * * *